(12) United States Patent
Gao

(10) Patent No.: US 11,825,636 B2
(45) Date of Patent: Nov. 21, 2023

(54) INTEGRATED RACK ARCHITECTURE FOR DISTRIBUTING TWO PHASE COOLANT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 84 days.

(21) Appl. No.: 17/405,848

(22) Filed: Aug. 18, 2021

(65) Prior Publication Data

US 2023/0055192 A1    Feb. 23, 2023

(51) Int. Cl.
*H05K 7/20*    (2006.01)

(52) U.S. Cl.
CPC .............. *H05K 7/208* (2013.01); *H05K 7/203* (2013.01); *H05K 7/20318* (2013.01); *H05K 7/20327* (2013.01)

(58) Field of Classification Search
CPC .... H05K 7/208; H05K 7/203; H05K 7/20318; H05K 7/20327
See application file for complete search history.

(56) References Cited

U.S. PATENT DOCUMENTS

| | | | |
|---|---|---|---|
| 10,905,030 B1 * | 1/2021 | Fernandes | H05K 7/20836 |
| 2011/0317367 A1 * | 12/2011 | Campbell | H05K 7/203 361/700 |
| 2013/0032310 A1 * | 2/2013 | Jaena | H05K 7/1497 165/138 |
| 2013/0133873 A1 * | 5/2013 | Campbell | H05K 7/20281 165/287 |
| 2014/0071626 A1 * | 3/2014 | Campbell | B23P 15/26 165/165 |
| 2014/0133096 A1 * | 5/2014 | Campbell | H05K 7/20781 165/47 |
| 2015/0009620 A1 * | 1/2015 | Kadotani | H05K 7/20809 361/679.47 |
| 2016/0330873 A1 * | 11/2016 | Farshchian | H05K 7/20672 |
| 2017/0086334 A1 * | 3/2017 | Riddle | H05K 7/20836 |
| 2017/0181328 A1 * | 6/2017 | Shelnutt | G06F 1/20 |
| 2018/0295744 A1 * | 10/2018 | Cader | H05K 7/20781 |
| 2019/0090383 A1 * | 3/2019 | Tufty | H05K 7/20263 |

* cited by examiner

*Primary Examiner* — Jacob R Crum
*Assistant Examiner* — Matthew Sinclair Muir
(74) *Attorney, Agent, or Firm* — WOMBLE BOND DICKINSON (US) LLP

(57) ABSTRACT

An electronic rack includes condensing, coolant distribution, and server regions. The condensing region includes a condensing container housing condensing coils and a coolant container to contain two phase coolant. The coolant distribution region includes a set of rack manifolds having at least a rack liquid supply line to receive coolant from the coolant distribution region, and a vapor line to return vapor to the coolant distribution region, a liquid return line. The server region is coupled to the condensing region and the coolant distribution region, the server region includes a number of server slots to receive a number of servers, where each of the servers is at least partially submerged within two phase liquid coolant, where, when the servers operate, the servers generate heat that is extracted by the two phase liquid coolant thereby causing at least some of the two phase liquid coolant to turn into a vapor.

18 Claims, 5 Drawing Sheets

INTEGRATED RACK ARCHITECTURE FOR DISTRIBUTING TWO PHASE COOLANT

FIELD OF THE INVENTION

Embodiments of the present invention relate generally to server and data center cooling. More particularly, embodiments of the invention relate to an integrated rack architecture for distributing two phase coolant.

BACKGROUND

Thermal management for a data center that includes several active electronic racks is critical to ensure proper performance of servers and other information technology (IT) equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. One common cooling unit is a computer room air conditioning (CRAC) unit that is a device that intakes hot exhaust return air and supplies cooling air to maintain a data center's thermal environment. With higher and higher power densities, designing the thermal management solution becoming more challenge. One effective way is to move the cooling liquid closer to the heat load, such as the electronics. With such method, not only the high power density can be managed, but also the cooling air requirement may significantly decreased.

Recently, data centers have been deploying high-power density electronic racks, where more high-density chips are packaged closer together to provide more computing power. Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

Immersion cooling, on the other hand, which involves at least partially submerging electronics in a non-conductive dielectric solution is a feasible solution for high-density electronics. Implementing immersion cooling in existing data centers, however, has challenges. For example, a data center's cooling infrastructure may need to be modified to be able to operate in an immersion cooling system, since existing data centers are designed for either air cooling or other types of liquid cooling. Also, immersion cooling is a more complex cooling solution than existing air/liquid solutions. For instance, single-phase immersion cooling requires complex hardware design for electronic components, mechanical pumps that may fail/leak, and significant room modification for deployment in a data center. As another example, conventional two phase immersion cooling systems include a condenser that is packaged within an immersion tank along with the submerged electronics (e.g., positioned above the electronics). When maintenance is performed (e.g., when a server needs to be replaced), a data center onsite operator must remove the condenser from the tank, thereby breaking the existing cooling loop which may lead to a loss of dielectric solution. In addition, in order to prevent overheating while performing maintenance, the electronics within the tank may be shut down, which results in service interruption. Immersion cooling can be understood as designing the thermal management with cooling fluid in direct contact with the electronics.

Existing solutions for electronic rack immersion have rack and fluid cooling/distribution segregated. The segregation requires additional cooling/distribution expansions which causes a lack of efficiencies in deployment, and operation of the electronic rack.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
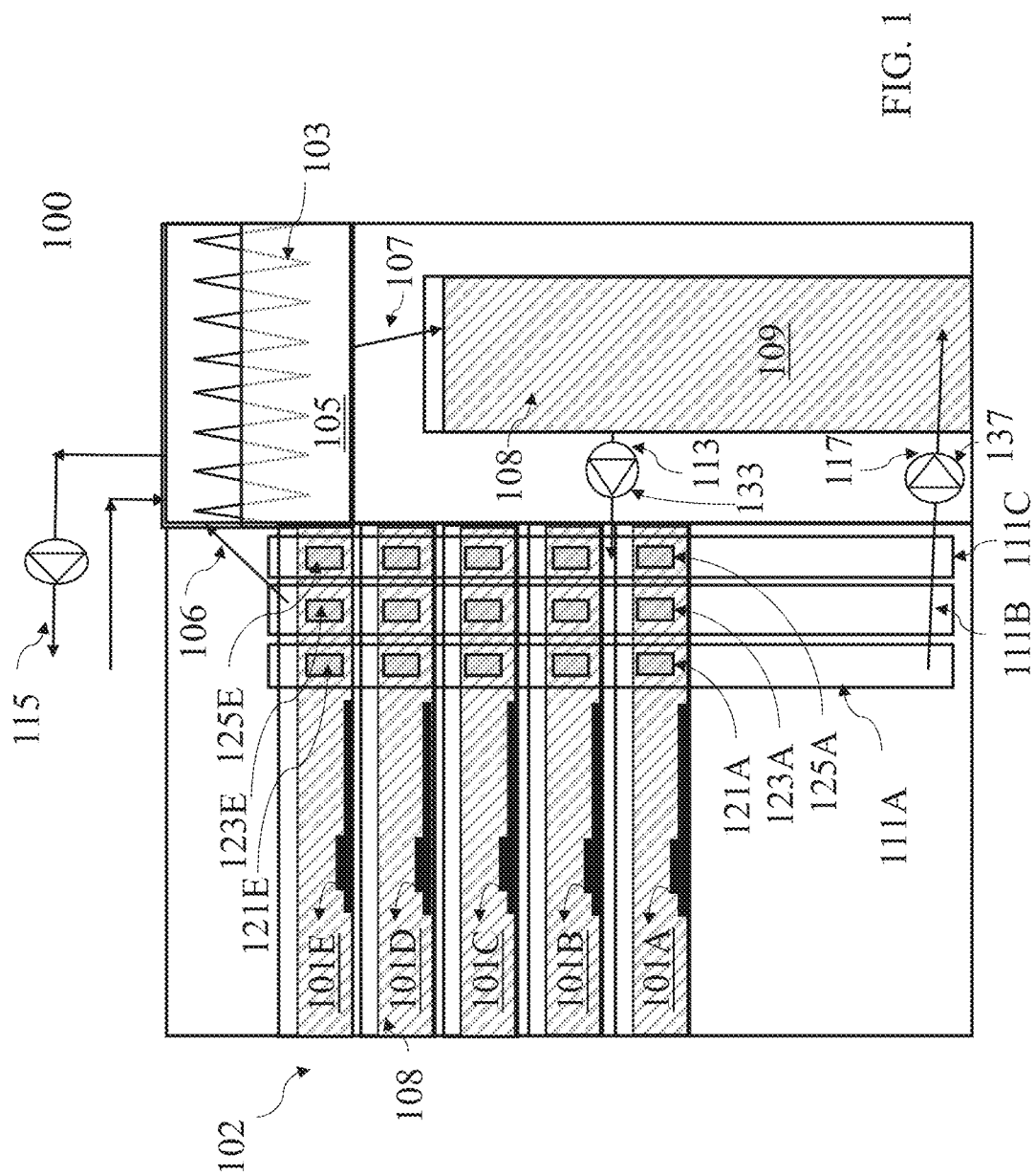
FIG. 1 is a block diagram illustrating a front view of a cooling system with one fluid loop according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current solution includes a cooling system of integrated electronic racks to distribute two phase coolant to servers populated at the racks, the solution having facility level and rack level co-designs. As further described in FIGS. 1-5, the solution can improve the design and deployment efficiency of high power density compute clusters and data centers.

According to a first aspect, an electronic rack of a data center includes a condensing region that includes a condensing container housing condensing coils and a coolant container situated at a height lower than the condensing container to contain two phase coolant. The condensing region in this specification can be understood as the region where vapor condensation is located and liquid coolant are collected. The electronic rack includes a coolant distribution region. The coolant distribution region includes a set of rack manifolds having at least a rack liquid supply line to receive a two phase coolant from the coolant distribution region and a vapor line to return a vapor to the coolant distribution region.

The electronic rack includes a server region coupled to the condensing region and the coolant distribution region, the server region includes a number of server slots to receive a number of servers, where each of the servers is at least partially submerged within two phase liquid coolant, where, when the servers operate, the servers generate heat that is transferred to the two phase liquid coolant thereby causing at least some of the two phase liquid coolant to turn into a vapor. The server, coolant distribution, and condensing regions are integrated within the electronic rack.

The rack manifolds further include a rack liquid return line to return two phase coolant back to the condensing region. The coolant container is directly connected to the condensing container of the condensing region.

The rack liquid supply line supplies a two phase liquid coolant from the coolant container to the plurality of servers, via a charging pump. The rack liquid return line returns a two phase liquid coolant from the plurality of servers to the coolant container via a return pump Each of the plurality of servers is housed within a corresponding immersion housing unit. The rack manifolds are fixed on the electronic rack, wherein the server region includes an adjustable server populating structure, wherein the adjustable server populating structure is adjustable for a server to connect to the rack manifolds.

The condensing coils are coupled to ceiling mounted facility liquid supply/return lines situated above the electronic rack. The coolant container is coupled to facility coolant supply/return lines situated beneath the electronic rack. The coolant supply/return lines are situated beneath a facility floor. In one embodiment, the coolant supply and return lines are designed on the surface of the facility floor.

FIG. 1 is a block diagram illustrating a front view of a cooling system 100 with one coolant loop according to one embodiment. Cooling system 100 can include an electronic rack 102 populated with servers 101A-101E and a set of coolant manifolds (or lines) 111A-111C. The servers 101A-101E can be situated in a server region, and the set of coolant manifolds 111A-111C can be situated in a coolant distribution region of electronic rack 102.

Servers 101A-101E can be configured to provide IT services. Specifically, servers 101A-101E may include a host server (referred to as a host node) and/or one or more compute servers (also referred to as computing nodes, such as CPU server and GPU server). The host server (having one or more CPUs) typically interfaces with clients (not shown in FIG. 1) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, servers 101A-101E can perform any type of computing task and/or can be any type of computing device (e.g., a server, a storage device, etc.). In one embodiment, servers 101A-101E can be edge computing devices. Thus, while servers 101A-101E provide the IT services, each of servers 101A-101E generates heat that is transferred to two phase coolant.

In one embodiment, coolant/rack manifolds (or lines) 111A-111C can include a liquid supply line 111C, a vapor return line 111B, and a liquid return line 111A. In one embodiment, each of servers 101A-101E include a set of liquid inlet, liquid outlet, and vapor outlet connectors (not shown). In one embodiment, each of manifolds 111A-111C include a set of connectors 121-125 assembled thereon. Liquid return line 111A can return a two phase liquid coolant from servers 101A-101E to secondary container 109 (e.g., via connectors 121A-121E). Liquid supply line 111C can supply a two phase liquid coolant to servers 101A-101E (e.g., via connectors 125A-125E). In one embodiment, the vapor return line 111B is situated in between liquid supply line 111C and liquid return line 111A. Vapor return line 111B can return a two phase coolant in vapor phase to fluid container 105 (e.g., via connectors 123A-123E). In one embodiment, the connectors are dripless blind-mating ones.

In one embodiment, each of servers 101A-101E can include an immersion module housing the server therein. The servers can include electronics which can generate heat during operation. The electronics can be submerged in the immersion cooling fluid within the server. The immersion module can include a set of ports, such as a two phase supply port to interface with liquid supply line 111C, a two phase coolant release port to interface with liquid return line 111A, and a vapor release port to interface with vapor return line 111B. Although three ports are described, in some embodiments, servers 101A-101E include only a two phase supply port and a vapor release port.

In one embodiment, electronic rack 102 can include a condensing region. The condensing region can include fluid container 105 and condensing coils 103 situated above fluid container 105. Fluid container 105 can receive two phase coolant in vapor phase from vapor manifold 111B via line 106. Condensing coils 103 can receive a supply of liquid cooling fluid (such as water) from an external source, via lines 115, to condense two phase coolant from vapor phase to liquid phase. A secondary container 109 can be situated beneath fluid container 105. Fluid container 105 and secondary container 109 can be connected directly via line 107.

In one embodiment, secondary container 109 is connected to liquid supply line 111C, via line 113. In one embodiment, line 113 includes a charging pump to actively facilitate liquid distribution from secondary container 109 to servers 101A-101E. In one embodiment, liquid return line 111A is connected to secondary container 109 via line 117. In one embodiment, line 117 includes a release pump to actively pump two phase liquid coolant 108 from servers 101A-101E to secondary container 109. In one embodiment, server, condensing, and coolant distribution regions are integrated within electronic rack 102 and/or is fabricated and co-design as part of electronic rack 102.

Figure 2:
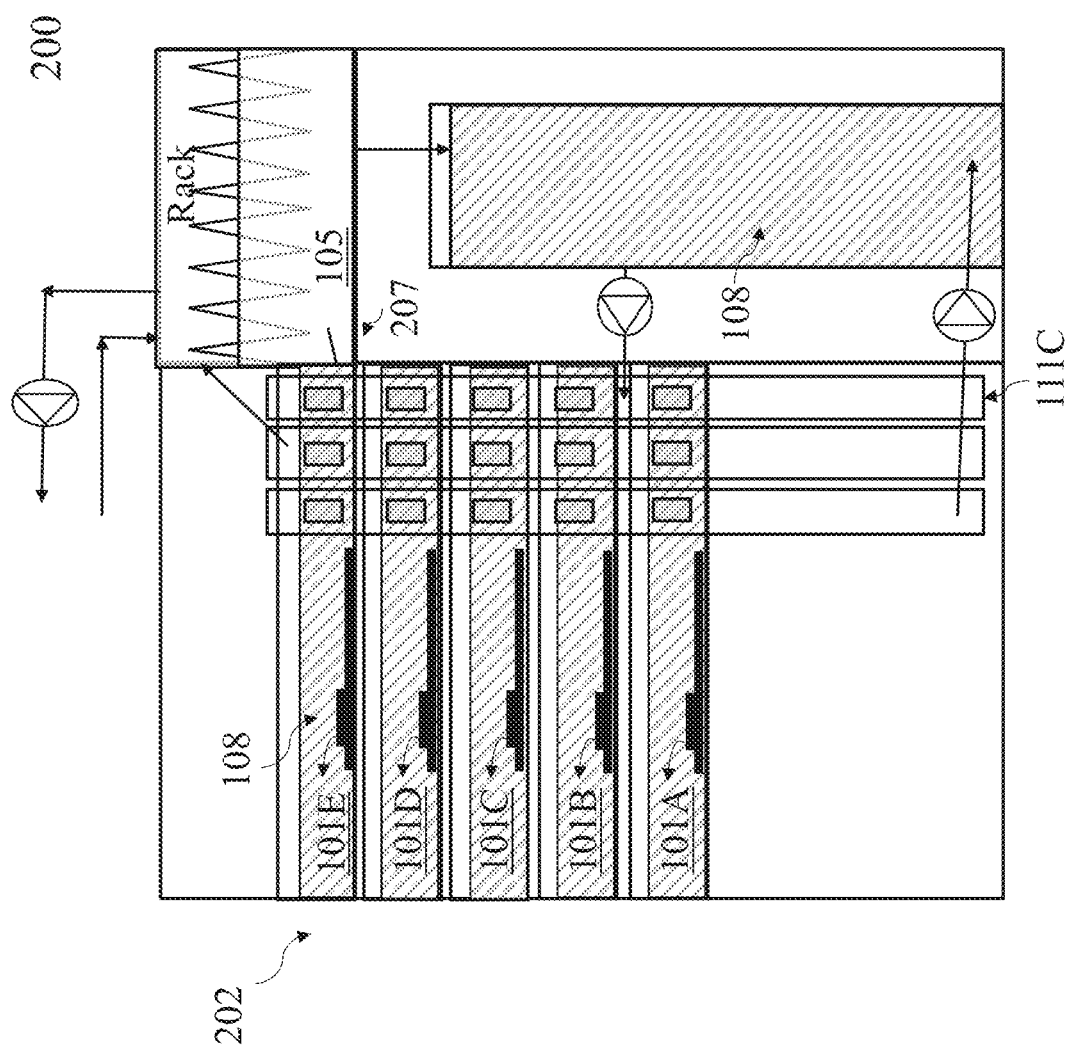
FIG. 2 is a block diagram illustrating a front view of a cooling system with two fluid loops according to one embodiment.

FIG. 2 is a block diagram illustrating a front view of a cooling system 200 with two fluid loops according to one embodiment. Racks 202 can be similar to racks 102 of FIG. 1, except for the additional line 207. For example, fluid container 105 can be directly connecting to fluid supply line 111C, via line 207. Since fluid container 105 and fluid supply line 112C can be co-designed, therefore, line 207 can be prefabricated or assembled on rack 202 before the servers are being deployed.

Figure 3:
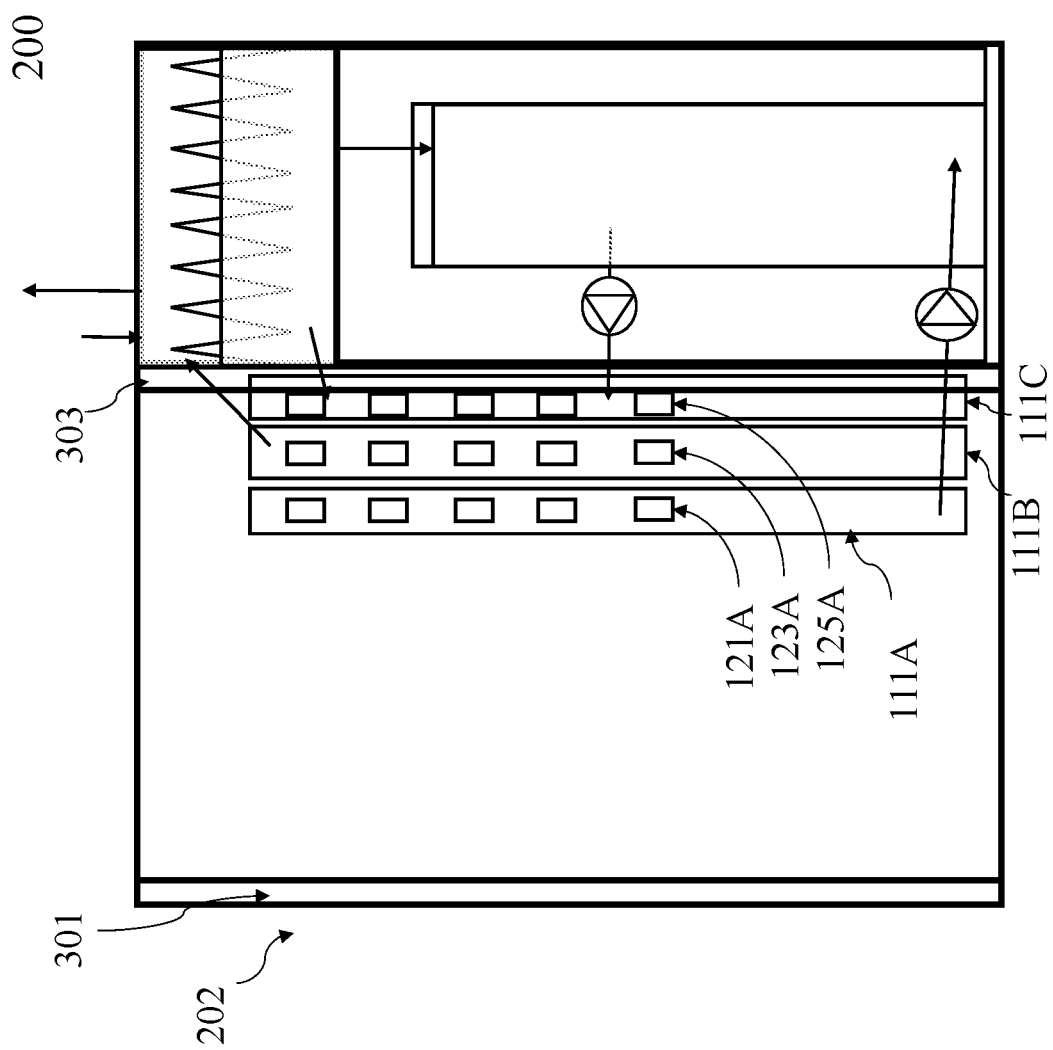
FIG. 3 is a block diagram illustrating a server populating structure of a cooling system according to one embodiment.

FIG. 3 is a block diagram illustrating a server populating structure of a cooling system 200 according to one embodiment. In one embodiment, cooling system 200 includes one or more server populating structures 301-303. Although shown as rack 202, cooling system 200 can include rack 102 of FIG. 1. In one embodiment, server populating structures 301-303 are adjustable modular units, which can be adjusted, removed, and/or inserted as a placeholder for server slots. Thus, server populating structures 301-303 can form one or more server slots to support servers that are contained therein. The adjustable features of the server populating structures 301-303 can adjust a height of the server slots, such that, servers, when populated, can be connected to manifolds 111A-111C.

In one embodiment, on each of manifolds 111A-111C, multiple connectors 121-125 may be assembled thereto.

The server populating structures 301-303 also enables the connectors of servers being populated to the rack 202 to match a height of the individual corresponding manifold connectors more accurately and, thus, connectors on the servers and connectors of the manifolds can be mated.

Figure 4:
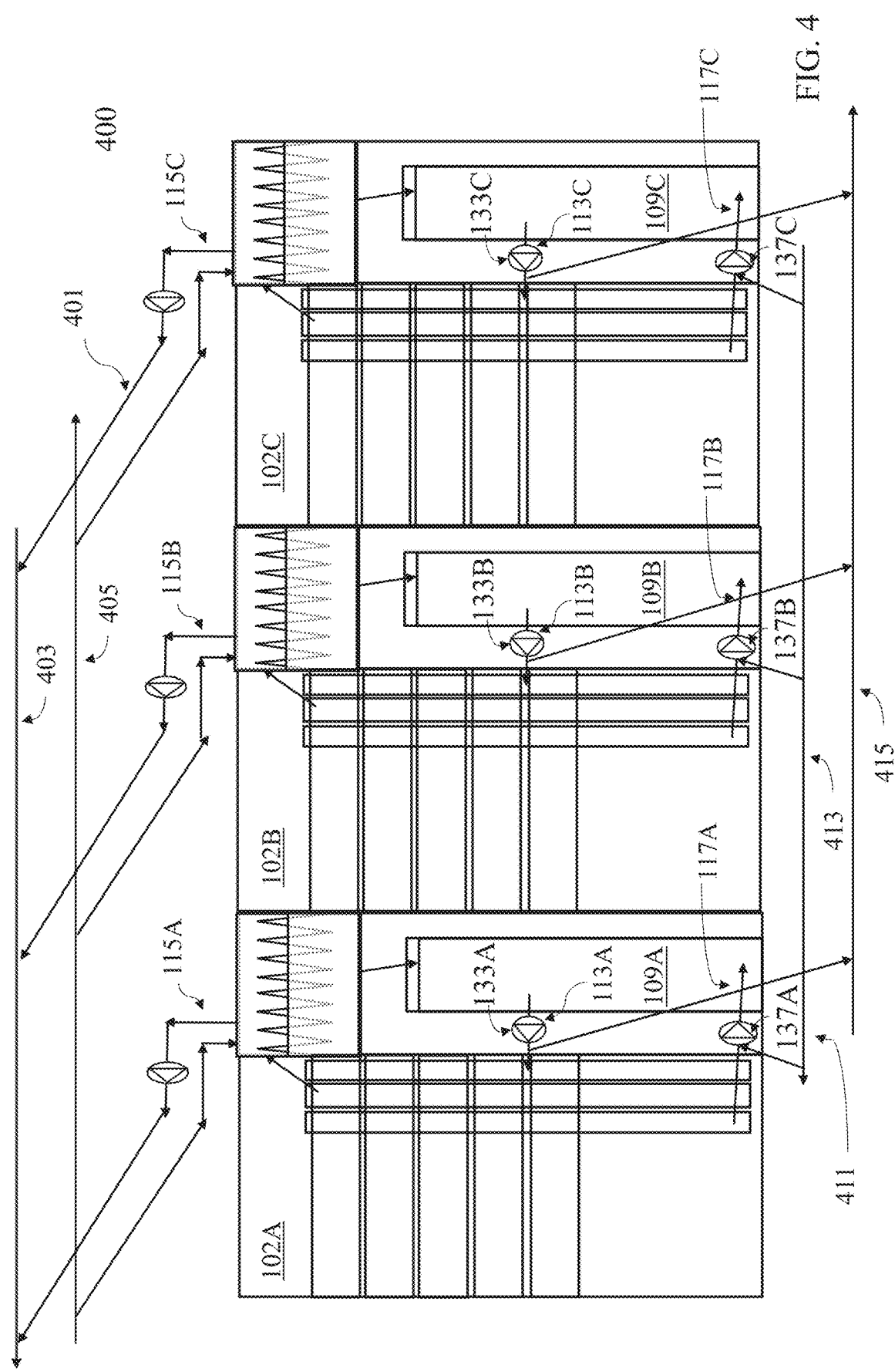
FIG. 4 is a block diagram illustrating a data center with a plurality of cooling systems according to one embodiment.

FIG. 4 is a block diagram illustrating a data center system 400 with a plurality of cooling systems according to one embodiment. In one embodiment, data center system 400 can be a heterogeneous cluster including an array of electronic racks, each having a number of server nodes. A heterogeneous cluster environment can contain processors and devices with different bandwidth and computational capabilities. Electronic racks 102A-102C can be racks 102 of FIG. 1 or racks 202 of FIG. 2. It can be seen that the system includes a cooling fluid recirculation loop 401 and a two phase coolant fluid distribution loop 411. In one embodiment, cooling fluid recirculation loop 401 includes a facility liquid supply line 403 and a facility liquid return line 405. The supply and returns lines 403-405 can be connected to condensing coils of each of the racks, via lines 115A-115C. In one embodiment, two phase coolant fluid distribution loop 411 can be connected to secondary containers 109A-109C of respective racks to interface individual racks to a facility level two phase coolant distribution. Two phase coolant fluid distribution loop 411 can include facility coolant supply line 413 connected at an inlet of a release pump 137A-137C and facility coolant return line 415 connected at an outlet of a charging pump 133A-133C. Facility coolant supply line 413 can be connected to supply lines 113A-113C and facility coolant return line 415 can be connected to liquid return lines 117A-117C of the racks In one embodiment, cooling fluid recirculation loop 401 can be mounted to a ceiling of data center facility. In one embodiment, two phase coolant fluid distribution loop 411 can be implemented beneath a facility flooring. In an embodiment, two phase coolant fluid distribution loop 411 can be directly implemented on a surface of the facility flooring.

Figure 5:
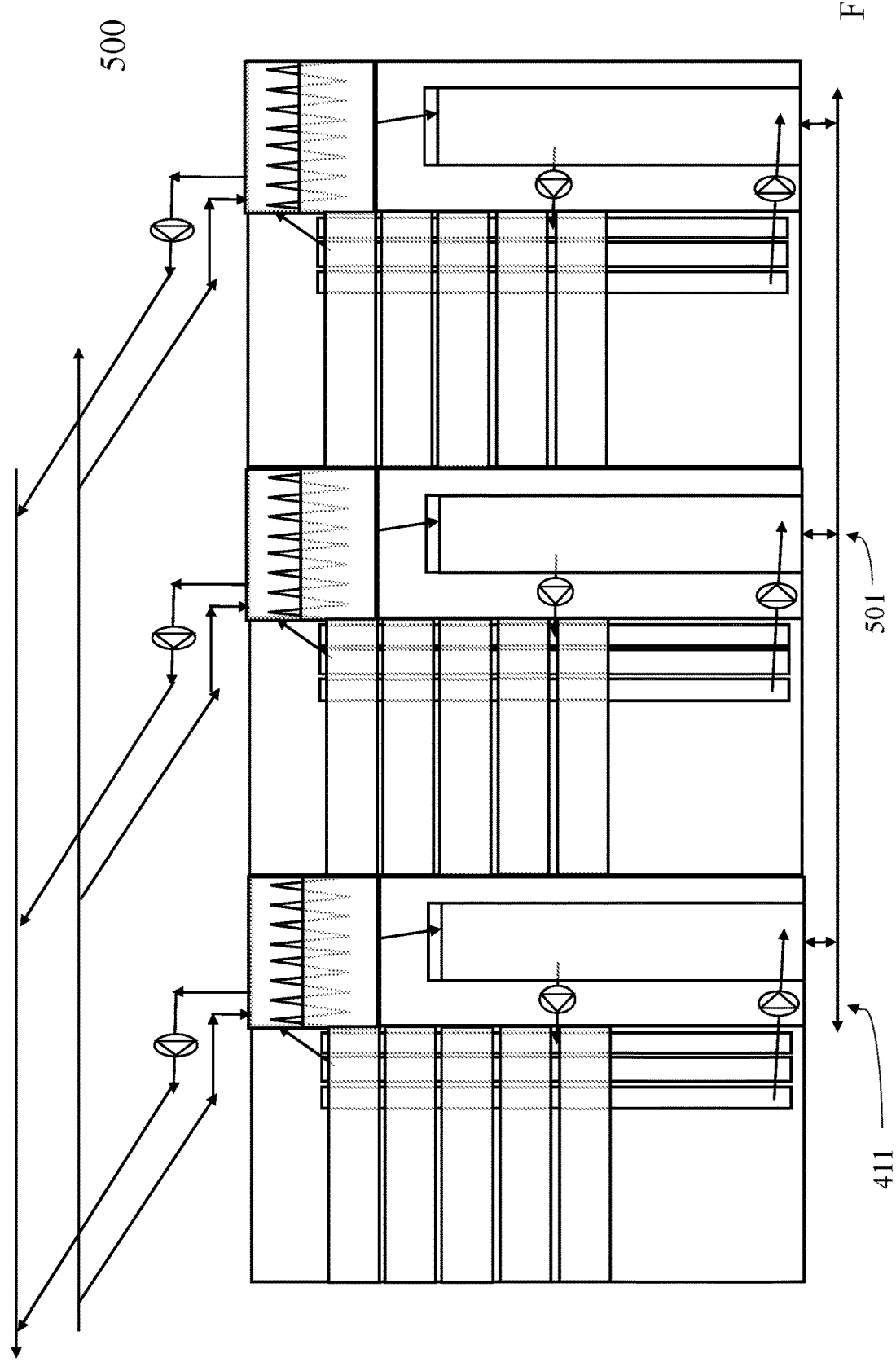
FIG. 5 is a block diagram illustrating a data center with a plurality of cooling systems according to one embodiment.

FIG. 5 is a block diagram illustrating a data center 500 with a plurality of cooling systems according to one embodiment. Data center 500 is similar to data center 400 of FIG. 4, except that two phase coolant fluid distribution loop 411 is connected to secondary containers 109A-109C directly, via one or more bi-directional lines or supply/return lines 501. In one embodiment, bi-directional lines or supply/return lines 501 can include valves (not shown) to control a flow to each of the racks. In this implementation, two phase coolant fluid can be stored at a facility pool (not shown), and be supplied to the racks or withdrawn from the racks, thus, increasing the data center system resilience.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
  a condensing region comprising:
    a condensing container housing condensing coils, and
    a coolant container situated adjacent to the condensing container and at a height lower than the condensing container to contain two phase coolant;
  a coolant distribution region, comprising:
    a set of rack manifolds having at least a rack liquid supply line to receive two phase coolant from the condensing region, and
    a vapor line to return the two phase coolant in a vapor phase to the condensing region; and
  a server region coupled to the condensing region and the coolant distribution region, the server region comprising a plurality of server slots to receive a plurality of servers, wherein each of the servers is at least partially submerged within the two phase coolant in a liquid phase, wherein, when the servers operate, the servers generate heat that is transferred to the two phase coolant in the liquid phase thereby causing at least some of the two phase coolant in the liquid phase to turn into the vapor phase,
  wherein the server, coolant distribution, and condensing regions are integrated within the electronic rack, wherein the set of rack manifolds further comprise a rack liquid return line to return the two phase coolant in the liquid phase from the coolant distribution region to the condensing region, and a return pump situated at the rack liquid return line, wherein the return pump is configured to directly pump the two phase coolant in the liquid phase from the coolant distribution region to the coolant container in the condensing region.

2. The electronic rack of claim 1, wherein the coolant container is directly connected to the condensing container of the condensing region.

3. The electronic rack of claim 1, wherein the rack liquid supply line supplies the two phase coolant in the liquid phase from the coolant container to the plurality of servers, via a charging pump.

4. The electronic rack of claim 1, wherein each of the plurality of servers is housed within a corresponding immersion housing unit.

5. The electronic rack of claim 1, wherein the set of rack manifolds are fixed on the electronic rack, wherein the server region includes an adjustable server populating structure, wherein the adjustable server populating structure is adjustable for a server to connect to the set of rack manifolds.

6. The electronic rack of claim 1, wherein the condensing coils are coupled to ceiling mounted facility liquid supply/return lines situated above the electronic rack.

7. The electronic rack of claim 1, wherein the coolant container is coupled to a facility coolant supply line and a facility coolant return line situated beneath the electronic rack.

8. The electronic rack of claim 7, wherein the facility coolant supply line is connected to an inlet of a release pump and the facility coolant return line is connected to an outlet of a charging pump.

9. A data center system, comprising:
an array of electronic racks, wherein each of the electronic racks comprises:
a condensing region comprising:
a condensing container housing condensing coils, and
a coolant container situated adjacent to the condensing container and at a height lower than the condensing container to contain two phase coolant;
a coolant distribution region, comprising:
a set of rack manifolds having at least a rack liquid supply line to receive two phase coolant from the condensing region, and
a vapor line to return the two phase coolant in a vapor phase to the condensing region; and
a server region coupled to the condensing region and the coolant distribution region, the server region comprising a plurality of server slots to receive a plurality of servers, wherein each of the servers is at least partially submerged within the two phase coolant in a liquid phase, wherein, when the servers operate, the servers generate heat that is transferred to the two phase coolant in the liquid phase thereby causing at least some of the two phase coolant in the liquid phase to turn into the vapor phase,
wherein the server, coolant distribution, and condensing regions are integrated within the electronic rack, wherein the set of rack manifolds further comprise a rack liquid return line to return the two phase coolant in the liquid phase from the coolant distribution region to the condensing region, and a return pump situated at the rack liquid return line, wherein the return pump is configured to directly pump the two phase coolant in the liquid phase from the coolant distribution region to the coolant container in the condensing region.

10. The data center system of claim 9, wherein the coolant container is directly connected to the condensing container of the condensing region.

11. The data center system of claim 9, wherein the rack liquid supply line supplies the two phase coolant in the liquid phase from the coolant container to the plurality of servers, via a charging pump.

12. The data center system of claim 9, wherein each of the plurality of servers is housed within a corresponding immersion housing unit.

13. The data center system of claim 9, wherein the set of rack manifolds are fixed on the electronic rack, wherein the server region includes an adjustable server populating structure, wherein the adjustable server populating structure is adjustable for a server to connect to the set of rack manifolds.

14. The data center system of claim 9, wherein the condensing coils are coupled to ceiling mounted facility liquid supply/return lines situated above the electronic rack.

15. The data center system of claim 9, wherein the coolant container is coupled to a facility coolant supply line and a facility coolant return line situated beneath the electronic rack.

16. The data center system of claim 15, wherein the facility coolant supply line is connected to an inlet of a release pump and the facility coolant return line is connected to an outlet of a charging pump.

17. The electronic rack of claim 1, wherein the condensing coils are to receive a supply of cooling fluid from an external source to cool the two phase coolant from vapor phase to liquid phase.

18. The electronic rack of claim 1, wherein the rack liquid return line is coupled to a facility supply line for the coolant container to receive two phase coolant from a facility source.

\* \* \* \* \*